US008728938B2

(12) United States Patent
Ivantsov et al.

(10) Patent No.: US 8,728,938 B2
(45) Date of Patent: May 20, 2014

(54) METHOD FOR SUBSTRATE PRETREATMENT TO ACHIEVE HIGH-QUALITY III-NITRIDE EPITAXY

(75) Inventors: Vladimir Ivantsov, Adelphi, MD (US); Anna Volkova, Gaithersburg, MD (US); Lisa Shapovalov, Gaithersburg, MD (US); Alexander Syrkin, Montgomery Village, MD (US); Philippe Spiberg, Laguna Beach, CA (US); Hussein S. El-Ghoroury, Carlsbad, CA (US)

(73) Assignee: Ostendo Technologies, Inc., Carlsbad, CA (US)

(*) Notice: Subject to any disclaimer, the term of this patent is extended or adjusted under 35 U.S.C. 154(b) by 0 days.

(21) Appl. No.: 13/533,812

(22) Filed: Jun. 26, 2012

(65) Prior Publication Data

US 2013/0337639 A1    Dec. 19, 2013

Related U.S. Application Data

(60) Provisional application No. 61/659,316, filed on Jun. 13, 2012.

(51) Int. Cl.
*H01L 21/44* (2006.01)
*C30B 13/02* (2006.01)
*C30B 31/02* (2006.01)
*C30B 29/40* (2006.01)

(52) U.S. Cl.
CPC .............. *C30B 31/02* (2013.01); *C30B 29/406* (2013.01)
USPC ...................................................... 438/676

(58) Field of Classification Search
CPC ............................ C30B 31/02; C30B 29/406
USPC ............................................................ 438/676
See application file for complete search history.

(56) References Cited

U.S. PATENT DOCUMENTS

| 6,086,673 | A | 7/2000 | Molnar |
| 6,462,357 | B1 * | 10/2002 | Tsai et al. ............... 257/97 |
| 6,528,394 | B1 | 3/2003 | Lee |
| 6,700,179 | B1 | 3/2004 | Ouchi et al. |

(Continued)

OTHER PUBLICATIONS

Cho, Yong S., et al., "Improved Crystalline Quality of GaN by Substrate Ion Beam Pretreatment", *Jpn. J. Appl. Phys.*, vol. 41, Part 1, No. 6B, (Jun. 2002), pp. 4299-4303.
Dunn, C. G., et al., "Comparison of Dislocation Densities of Primary and Secondary Recrystallization Grains of Si-Fe", *Acta Metallurgica*, vol. 5, (Oct. 1957), pp. 548-554.

(Continued)

*Primary Examiner* — William D Coleman
(74) *Attorney, Agent, or Firm* — Blakely Sokoloff Taylor & Zafman LLP

(57) ABSTRACT

The present invention relates to a method for producing a modified surface of a substrate that stimulates the growth of epitaxial layers of group-III nitride semiconductors with substantially improved structural perfection and surface flatness. The modification is conducted outside or inside a growth reactor by exposing the substrate to a gas-product of the reaction between hydrogen chloride (HCl) and aluminum metal (Al). As a single-step or an essential part of the multi-step pretreatment procedure, the modification gains in coherent coordination between the substrate and group-III nitride epitaxial structure to be deposited. Along with epilayer, total epitaxial structure may include buffer inter-layer to accomplish precise substrate-epilayer coordination. While this modification is a powerful tool to make high-quality group-III nitride epitaxial layers attainable even on foreign substrates having polar, semipolar and nonpolar orientation, it remains gentle enough to keep the surface of the epilayer extremely smooth. Various embodiments are disclosed.

21 Claims, 5 Drawing Sheets

(56) References Cited

U.S. PATENT DOCUMENTS

| | | |
|---|---|---|
| 7,374,615 B2 * | 5/2008 | Dwilinski et al. ............ 117/68 |
| 7,473,570 B2 | 1/2009 | Lai |
| 2010/0012948 A1 | 1/2010 | Usikov et al. |
| 2011/0108954 A1 | 5/2011 | Spiberg et al. |

OTHER PUBLICATIONS

Kovalenkov, O., et al., "Thick AlN layers grown by HVPE", *Journal of Crystal Growth*, 281, (May 25, 2005), pp. 87-92.

Naniwae, Kouichi, et al., "Growth of Single Crystal GaN Substrate Using Hydride Vapor Phase Epitaxy", *Journal of Crystal Growth*, 99, (1990), pp. 381-384.

\* cited by examiner

10 µm²

RMS roughness = 0.983 nm

10 µm²

RMS roughness = 0.373 nm

METHOD FOR SUBSTRATE PRETREATMENT TO ACHIEVE HIGH-QUALITY III-NITRIDE EPITAXY

CROSS-REFERENCE TO RELATED APPLICATIONS

This application claims the benefit of U.S. Provisional Patent Application No. 61/659,316 filed Jun. 13, 2012.

BACKGROUND OF THE INVENTION

1. Field of the Invention

The present invention relates to III-V compound semiconductors and more particularly to a method for producing III-Nitride semiconductor substrate materials.

2. Prior Art

It would be considered common knowledge that for successful epitaxial growth, the proper preparation of a substrate surface is required. In general, the preparation consists of two major readily distinguishable steps. The first step is essentially similar for any substrate material and comprises lapping and polishing, annealing, degreasing and cleaning in organic and inorganic solvents. The second step is unique for every substrate material and can be regarded as a fine tuning of the substrate surface towards the material to be deposited. The present invention relates to the second step in preparation of the substrate for the epitaxial growth of Group-III nitride; herein referred to as III-Nitrides, compounds including gallium nitride (GaN), aluminum nitride (AlN), indium nitride (InN), and their alloys comprising nitrogen and Group-III semiconductors. It is equally effective for the pretreatment of both native and foreign substrates that is specifically important for the nitride semiconductors because of severe deficiency of the native substrates.

The III-Nitrides semiconductors attract attention as an exclusive platform for optoelectronic and power electronic devices enabling a wide range of applications from everyday general lighting to long distance communications. The generation and transfer of high energy fluxes through the crystalline solids of materials such as III-Nitrides semiconductors escalate dissipation processes caused by structural defects. Consequently, even a slight decrease in defect density of the material promotes expeditious realization of its ultimate merit. Reduction of the defects in the epitaxial III-Nitride layers has become a central issue in the development of the next generation III-Nitride devices. Most notably, the vast majority of the defects are generated at the substrate-layer interface. Accordingly, in order to mitigate the adverse effects of crystalline defects, optimal treatment of the substrate upon which the III-Nitride layer is grown is considered to be the most feasible way to achieve exceptional quality epilayers.

In U.S. Pat. No. 6,528,394, a method of GaN film growth on a sapphire substrate after multi-step pretreatment was disclosed. The bare sapphire substrate is nitridated in a growth reactor with ammonia, then sequentially exposed to a gas mixture of $NH_3$ and HCl, after that an additional nitridation is applied. In one embodiment of that invention, hydride vapor phase epitaxial (HVPE) growth of a GaN film on a pretreated sapphire substrate was described. As a result of the growth, a mirror-like GaN film with still easily defined slight surface roughness is deposited. As it becomes clear from that patent description, the film achieves comparatively low structural quality characterized by 400 arcsec Full Width at Half Maximum (FWHM) for (00.2) symmetric x-ray diffraction (XRD) rocking curve (RC) that corresponds to the upper half of $10^8$ $cm^{-2}$ dislocation density.

U.S. Pat. No. 6,086,673 discloses a method of pretreatment a substrate that includes, first, formation of a pretreatment layer on the substrate, and, second, exposing this layer to a gaseous thermo-chemically reactive environment. As an embodiment of that patent, the pretreatment layer of ZnO is deposited on a sapphire substrate and then subjected to a gaseous environment that includes hydrochloric acid (HCl) and ammonia ($NH_3$) thermo-chemically reactive to ZnO. Then, an epitaxial layer of GaN is grown in an HVPE process on the pretreated surface. As a result of the pretreatment, structural quality of the GaN epilayer is improved but not too much and remains even for more than 70 μm layer at high $10^8$ $cm^{-2}$ dislocation density level. There is no indication in the patent description that the disclosed pretreatment positively influences the achieved morphology of the epilayer.

Another U.S. Pat. No. 7,473,570 discloses the growth of GaN layer with less dislocation density on a sapphire substrate that is treated using reaction precursors $Cp_2Mg$ and $NH_3$. Subsequent GaN deposition is carried out on a GaN-based buffer layer formed on the substrate to build epitaxial structure between the substrate and the layer. In that patent, it is claimed that such treatment together with the buffer structure can reduce effectively the dislocation density, thereby, high-quality epitaxy can be gained and the uniformity in the distribution of the dislocations can be improved. While some structural improvement of the epitaxial GaN is indeed observed, the dislocation density achieved by the disclosed method is still far above $10^8$ $cm^{-2}$ level, which is unacceptable for some advanced device structures, such as laser diodes, for example.

Further, U.S. Pat. No. 6,700,179 discloses treatment of the surface of a substrate for GaN epitaxy with silicon (Si) using silane ($SiH_4$) as a silicon precursor. Acting as an anti-surfactant, Si is thought to promote better crystallization of a subsequent epitaxial layer if its optimal amount in controllable configuration is deposited. But difficulties to effectively control the uniformity and intensity of the treatment result in poor reproducibility of the process and non-uniform stress distribution in epitaxial layers.

In the paper of K. Naniwae, S. Itoh, H. Amano, K. Itoh, K. Hiramatsu and I. Akasaki, Growth of single crystal GaN substrate using hydride vapor phase epitaxy (J. Crystal Growth 99 (1990) 381), treatment of the sapphire substrate by gallium chloride (GaCl) just before the growth of GaN is mentioned. It is found that the implication of the GaCl pretreatment improves nucleation conditions, reduces the pit density and makes overall quality of grown GaN epilayer better. But, reduction of such coarse imperfections, as pits, is accompanied with neither the apparent decrease in the dislocation density any lower than $10^8$ $cm^{-2}$ level nor the smoothing of the inter-pit epilayer surface.

In another paper of Y. S. Cho et al. (Y. S. Cho J. Jhin, E. K. Koh, Y. J. Park, E. K. Kim, G. Kim, S. K. Min and D. Byun, Improved Crystalline Quality of GaN by Substrate Ion Beam Pretreatment, Jpn. J. Appl. Phys. 41 (2002) p. 4299), ion-beam pretreatment of a sapphire substrate is carried out aiming for the reduction of strains and dislocations in MOCVD GaN epilayer to be grown on that substrate. The 800 eV a reactive $N2^+$ and the 55 keV $N^+$ ion beams are used from a normal ion implanter ($N^+$-implantation). Pretreatment with both ion beams results in the formation of a disordered amorphous phase on the substrate surface. It is found that the ion beam pretreatment favors a decrease in the strain and defect states in the GaN epilayer. But, roughness as well as dislocation density of the epilayers still have to be reduced considerably to make them suitable for the next-generation devices.

DETAILED DESCRIPTION OF THE PREFERRED EMBODIMENTS

Figure 1:
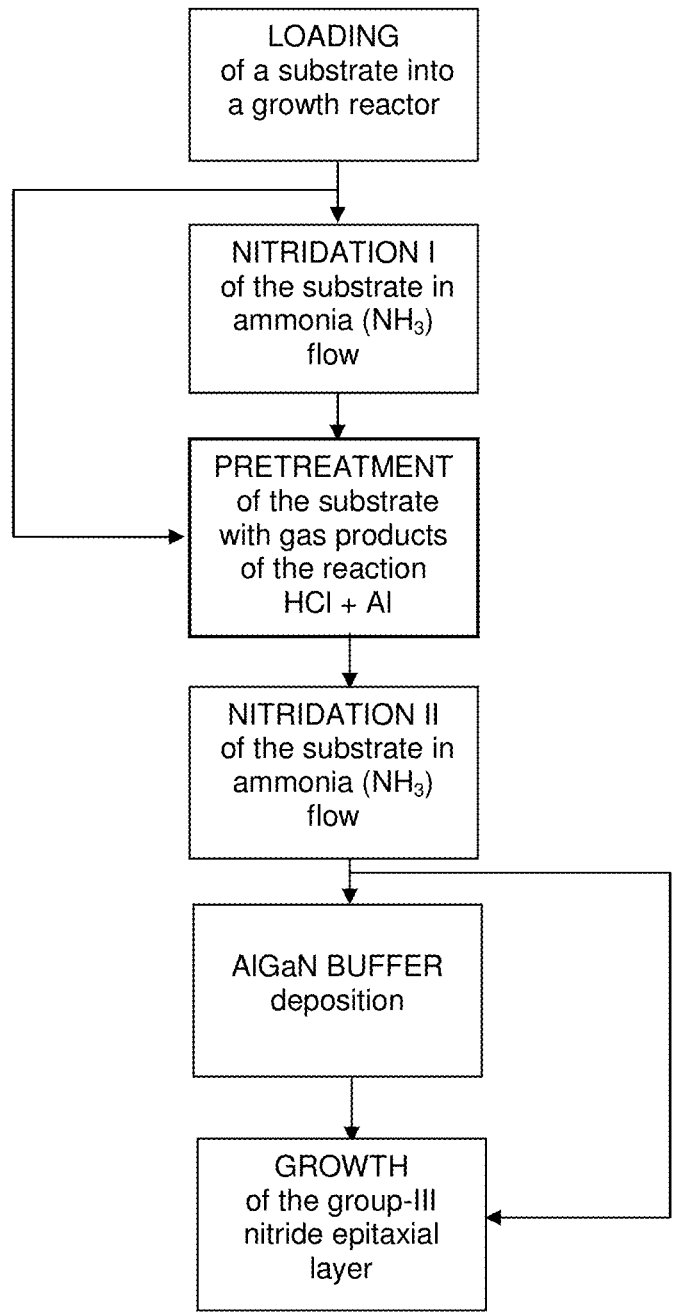
FIG. 1 is an example of a flow chart of the HVPE growth run that includes the disclosed pretreatment of a substrate inside the growth reactor with the gas products of the reaction between aluminum and hydrogen chloride.

It is well recognized that pretreatment of a substrate has a significant impact on the quality of the epitaxial growth of III-Nitride layers. This invention presents a method for the pretreatment of a substrate which ensures substantially improved structural perfection and surface smoothness for III-Nitride epitaxial layer to be grown on that substrate.

The method involves exposure of the substrate to a gaseous environment containing gaseous products of the reaction between metallic aluminum and gaseous hydrochloric acid. The products essentially include gaseous hydrogen and aluminum chloride which are to a certain extent chemically reactive with the substrate. Acting together, hydrogen and aluminum chloride modify the surface of the substrate in such a way that makes this surface much more compliant with the III-Nitride epitaxy. Nucleation of the III-nitride after the disclosed pretreatment becomes optimal for the growth of high quality and low roughness epilayer.

In the Preferred embodiments described in the subsequent sections, the effect of the pretreatment on the HVPE growth of GaN on sapphire, and AlN on SiC substrates is described. The pretreatment is equally effective for sapphire, SiC and other substrates, like Si, GaAs or $LiAlO_2$, which are frequently used in HVPE, MOCVD, or MBE growth of III-Nitrides. It can be applied to native GaN substrates as well to facilitate undisturbed conditions for homoepitaxial growth. Moreover, the disclosed pretreatment is equally effective for both native and foreign substrates having polar, semipolar and nonpolar orientation.

Generally, but not necessarily, the disclosed method of the pretreatment is carried out after loading a substrate into a growth reactor and after nitridation of the substrate in an ammonia flow. The pretreatment is usually followed by either the additional nitridation or by the growth of an intermediate buffer (nucleation) layer, or by the immediate growth of the III-Nitride epilayer.

In order to confirm the effectiveness and clarify the advantages of the present invention, its detail description in the preferred embodiments accompanied with figures and results of x-ray diffraction (XRD), atomic force microscopy (AFM), and Nomarski differential interference contrast (DIC) optical microscopy, is provided.

In accordance with the present invention, the pretreatment with the gas products of the reaction between aluminum and hydrogen chloride dramatically improves nucleation and growth quality of III-Nitride layer. Moreover, it can be successfully employed for various types of substrates, including native gallium nitride (GaN) and aluminum nitride (AlN), and foreign substrates such as sapphire ($Al_2O_3$), silicon carbide (SiC), silicon (Si), gallium arsenide (GaAs), lithium aluminate ($LiAlO_2$), spinel ($MgAlO_4$) having polar, semipolar and non-polar orientation. The substrate may also be presented as an appropriate stacking arrangement of these materials, for instance, SiC on Si or AlN on sapphire or, even, quartz mask on a GaN/sapphire template.

While in the Preferred Embodiments the description of the pretreatment process in the HVPE growth of GaN and AlN is provided as examples, the pretreatment process of this invention is not confined to HVPE environment but can be effectively employed as a substrate conditioning step in MOCVD or MBE procedures as well and for a whole set of (Al,Ga,In)N III-Nitride based materials, including their ternary and quaternary alloys epitaxially grown in either polar, semi-polar and non-polar crystal orientation.

In the Preferred Embodiments the pretreatment is conveniently conducted inside the growth reactor just before the deposition of an epilayer is completed. But there is no such a rigorous requirement for combining the pretreatment procedure and subsequent epitaxial growth process into the same run simultaneously. The pretreatment can also be accomplished separately in a specially designed chamber. In this case the pretreated substrates will then be conserved in a clean, preferably vacuum-tight, storage for the further implementation.

All of the runs to be disclosed in the Preferred Embodiments are carried out using a horizontal open-flow quartz lining HVPE reactor under atmospheric pressure. The reactor consists primarily of three zones, the source zone, the dwell zone and the deposition zone, each of them having their own characteristic temperature and gas-flow pattern. The efficient design of the reactor renders the optimum conditions for metal-precursor formation in the source zone, as well as pretreatment and nitride growth in the deposition zone, and idle and annealing operations in the dwell zone, in a sense independently. The geometry of the reactor and adjusted flow rates of gases make the flow pattern in the deposition zone laminar, which is favorable for the fine-controlled and manageable pretreatment and growth process. The length of the reactor and uniformity in temperature distribution are sufficient enough to operate with 3-4 substrates at a time.

The effect of the pretreatment method using gas products of the reaction between aluminum and hydrogen chloride is verified by the exemplary pretreatment of sapphire substrates for the HVPE GaN growth (Embodiment 1), and by the exemplary pretreatment of SiC substrates for the HVPE AlN growth (Embodiment 2).

The pretreatment method of this invention is described herein using the following exemplary embodiments.

Embodiment 1

A (0001) sapphire ($\alpha$-$Al_2O_3$) substrate is used for the pretreatment and subsequent epitaxial deposition of the gallium nitride (GaN) layer by hydride vapor-phase epitaxial (HVPE) technique. According to the present invention, pretreatment of the sapphire substrate is performed using gas-products of the reaction between aluminum (Al) and hydrogen chloride (HCl). The reaction takes place in the source zone of the reactor where metallic Al reacts with the gaseous HCl flowing over it. The transport of the gas products to the deposition zone is assisted by argon (Ar) as a carrier gas. However, carrier gases such as hydrogen (H), nitrogen (N), argon (Ar), helium (He) or their mixtures can also be used. Before and after the pretreatment, nitridation of the substrate in ammonia ($NH_3$) gas flow and intermediary buffer layer deposition can be executed. The growth of GaN after the pretreatment employs gallium chloride (formed in the source zone of the reactor) and ultra-pure gaseous ammonia acting as precursors for Group III and V elements, respectively. Structural and morphological properties of GaN layer are examined and compared with those characteristic for GaN grown without the invented pretreatment.

Referring to FIG. 1, the sapphire substrate wafer is loaded into the dwell zone of the reactor (FIG. 1, LOADING) and heated to 1030° C. Then, in the first nitridation step the substrate wafer is moved to the deposition zone and kept for the next 10 min in the $NH_3$ stream flowing at 6 standard liter per minute (slm) rate (FIG. 1, NITRIDATION I) at a temperature of 1030° C. After that, while still in the deposition zone of the reactor at the temperature of 1030° C., the sapphire substrate is pretreated for 1 min with the gas-products of the reaction between metallic Al and gaseous HCl flowing over at 50 standard cubic centimeter per minute (sccm) rate (FIG. 1, PRETREATMENT). Following the pretreatment, a second nitridation of the substrate is carried out at 6 slm $NH_3$ flow rate for 20 min (FIG. 1, NITRIDATION II) at a temperature of 1030° C. Just prior to the growth of GaN epilayer, the deposition of a thin $Al_xGa_{1-x}N$ buffer layer is executed for 5 sec by injecting into the deposition zone simultaneously $NH_3$ gas and HCl gas passed over the aluminum and gallium loadings in separate channels (FIG. 1, AlGaN BUFFER). Growth of the GaN epilayer is conducted for 6 min providing 9.5 µm thick epilayer (FIG. 1, GROWTH). The growth run ends with ~30 min slow taking the substrate off the reactor to prevent thermal shock fracture. All of the steps except the pretreatment are identical to those of a regular HVPE procedure.

Figure 2A:
FIGS. 2A and 2B (the width of the images is 600 μm) are the examples of the Nomarski differential interference contrast (DIC) images from the surface of the GaN film grown on the sapphire substrate using conventional pretreatment (FIG. 2A), and using the pretreatment method according to the present invention (FIG. 2B). Visibly smoother surface of the film in FIG. 2B indicates superior effectiveness of the disclosed pretreatment method.
Figure 2B:
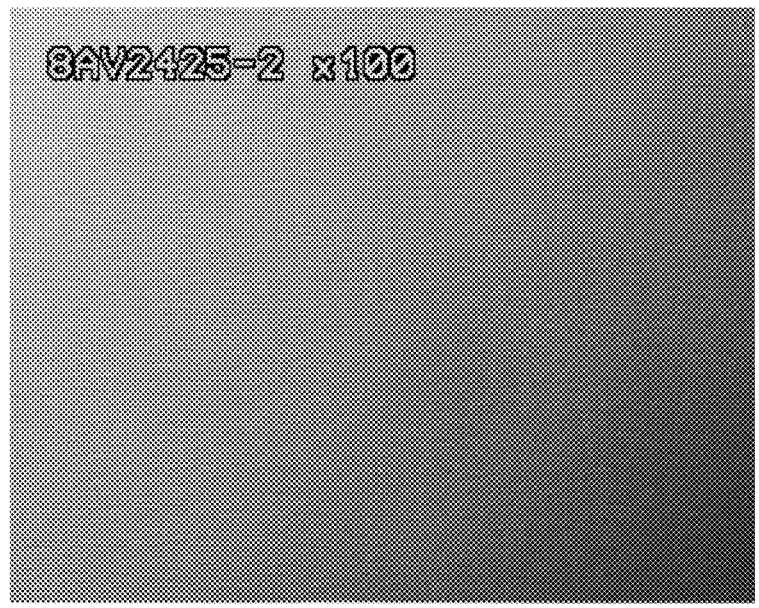

FIGS. 2A and 2B present the examples of a comparative Nomarski differential interference contrast (DIC) microscopy study of the surfaces of two GaN samples: the first one was grown using the regular HVPE procedure without the invented pretreatment (FIG. 2A), and the second one was grown with the invented pretreatment (FIG. 2B). Qualitative comparative observations evidence of FIG. 2A and FIG. 2B indicate a much smoother surface morphology for the second epilayer. Note that both epilayers have similar approximately 7 µm thicknesses and were grown at the same temperature and ~1 µm/min average growth rate. Numerous small wrinkles and waves that are featured surface of the first epilayer of FIG. 2A practically disappear on the second sample of FIG. 2B.

Figure 3A:
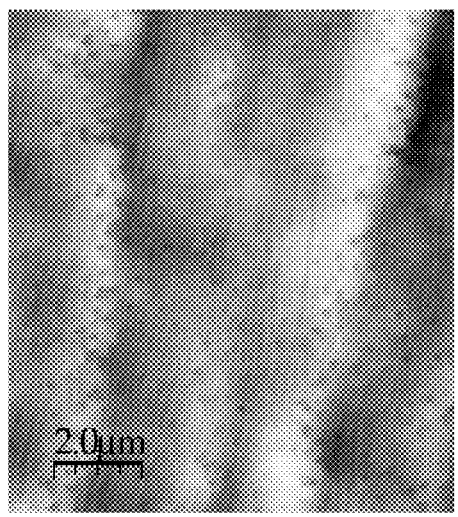
FIGS. 3A and 3B are the atomic-force microscopy (AFM) images and roughness data on the GaN films grown on sapphire substrates using standard HVPE procedure (FIG. 3A) and procedure that includes the present invention pretreatment method (FIG. 3B). The measurements are done at the center of the films. For $10\times10\,\mu m^2$ scan, the root-mean-square (RMS) roughness of the films are 0.983 nm and 0.373 nm, respectively. The measurements confirm that the disclosed pretreatment method substantially improves flatness of GaN epilayer and lowers its characteristic RMS.
Figure 3B:
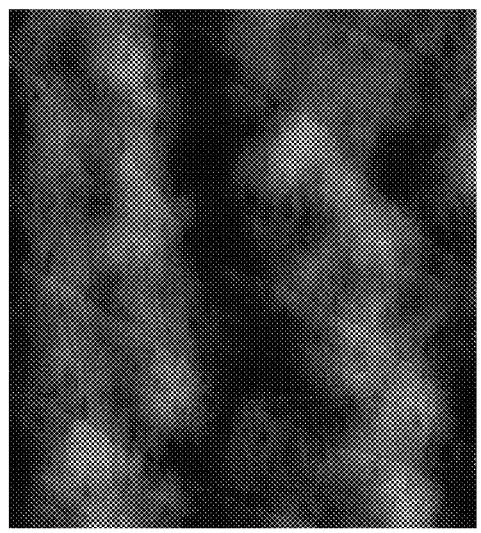

FIGS. 3A and 3B show atomic force microscope (AFM) images of the GaN epilayers grown without the substrate surface pretreatment of this invention (FIG. 3A) and with the substrate surface pretreatment of this invention (FIG. 3B). These figures quantitatively confirm previous qualitative observations of FIG. 2 and FIG. 2B. Along with the growth steps, well-developed surface undulation makes root-mean-square (RMS) roughness of the first surface very close to 1 nm, while the surface of the anew pretreated sample is characterized by growth steps only, producing less than 0.4 nm RMS roughness. The measurements show that the pretreatment method of this invention substantially improves the surface morphology of the grown GaN epilayer and lowers its flatness characteristic RMS more than twice. If one presumes that wavy macro-morphology of the surface could be a result of the initial treatment of the substrate surface, it becomes clear that standard treatment of the substrate is much more harmful than that of the proposed in the present invention. As evident from FIG. 3B, the sapphire substrate surface left after the invented pretreatment does not in the least compromise flatness of the deposited epilayer. It is worth noting that pretreatment temperature as well as nitridation temperature can be made lower or higher than that one used in the Embodiment but it must not exceed thermal stability temperature of the substrate surface.

Figure 4A:
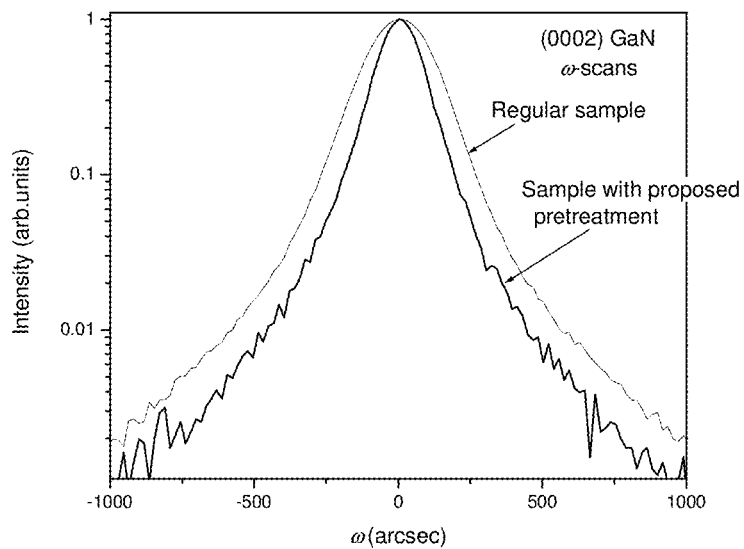
FIGS. 4A and 4B are the examples of the XRD rocking curves for (0002) and (1012) reflexes of the 9.5 μm GaN films grown on a sapphire substrate pretreated according to the present invention method (FIGS. 4A and 4B lower solid lines) and regular conditioned (FIGS. 4A and 4B upper solid lines) before the HVPE growth. The values of the full width at half-maximum for (0002) reflexes are 167 arcsec (lower solid line) and 298 arcsec (upper solid line, FIG. 4A), and 303 arcsec (lower solid line) and 481 arcsec (upper solid line) for (1012) reflexes (FIG. 4B).
Figure 4B:
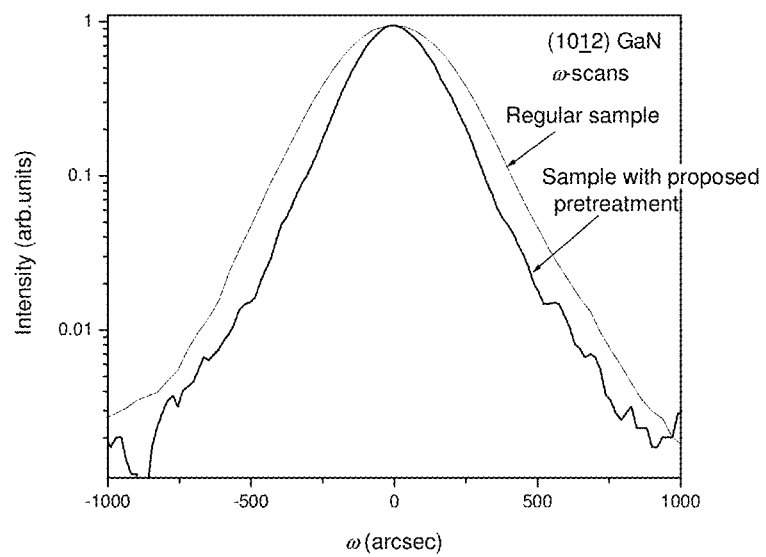

It is not only that the surface morphology of the grown GaN epilayer becomes substantially better; but also the method of the substrate surface pretreatment of this invention remarkably improves crystalline structure of the grown epilayer which, for the first time in the epitaxial growth of GaN on pretreated substrate, contains screw dislocations at $10^7$ $cm^{-2}$ density in less than 10 µm GaN. The validity of this statement is substantiated in FIG. 4A which shows two rocking curves (RCs) for (0002) symmetric scans from two GaN samples, one grown on a substrate pretreated using a conventional method (upper solid line) and a second GaN sample grown on a substrate pretreated using a method of this invention (lower solid line). Both GaN samples are 9.5 µm thick and have similar doping profiles. But, while for the conventional pretreatment sample the RC full width at half maximum (FWHM) is 268 arcsec, for the sample pretreated using the method of this invention is 167 arcsec, which is ~100 arcsec less. Based on mosaic crystal model equations (C. Dunn, E. Koch, Acta Metall. 5 (1957) 548), the estimated density of screw dislocations for the former sample is $1.4 \cdot 10^8$ $cm^{-2}$ and $5.6 \cdot 10^7$ $cm^{-2}$ for the latter samples, which is an estimated improvement by a factor of 2.5×. These results mean that all physical parameters of the second sample that influenced by scattering on screw dislocations are improved. The same is true for the edge and mixed dislocations, because their density is reduced as well, since RCs for (1012) asymmetric scans (FIG. 4B) narrows from 429 arcsec to 307 arcsec. Definitely, samples with improved crystalline structure are better suited for the next generation GaN-based devices.

Figure 5A:
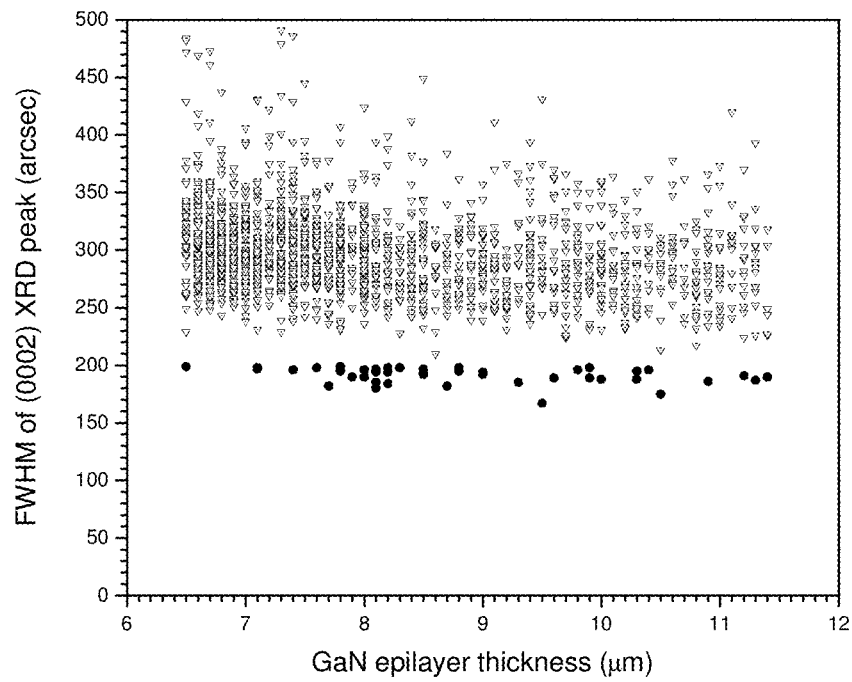
FIGS. 5A and 5B are the XRD data taken from 6.5-11.5 μm thick epilayers for FWHMs of the (0002) symmetric and (1012) asymmetric scans, respectively. In average, the (0002) FWHM for the anew pretreated samples is 191 arcsec (FIG. 5A, solid circles) and 298 arcsec for the regular samples (FIG. 5A, empty inverted triangles). The average values for the (1012) FWHMs are 337 arcsec for the anew pretreated samples (FIG. 5B, solid circles) and 481 arcsec for the regular samples (FIG. 5B, empty inverted triangles).
Figure 5B:
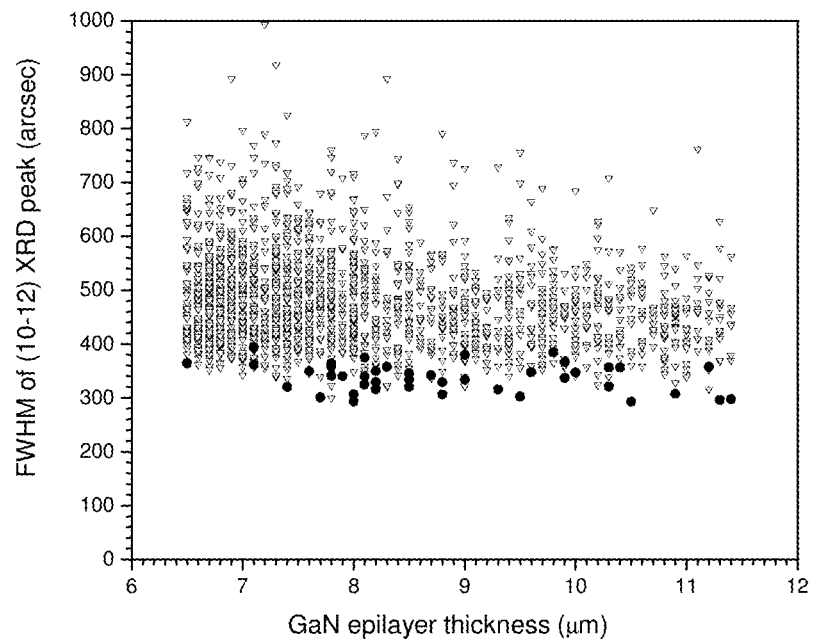

Application in a regular manner of the invented pretreatment method to the HVPE GaN procedure demonstrates its reliability and reproducibility. FIGS. 5A and 5B depicts the actual XRD data taken from multiple GaN epilayer samples with thicknesses in the range from 6.5 µm to 11.5 µm for FWHMs of the (0002) symmetric and (1012) asymmetric scans; respectively. As can be seen from both plots, the solid circles denoting the samples pretreated with the pretreatment method of this invention occupy the lowest position values with better x-ray characteristics over all the entire thickness range. In average, the (0002) FWHM for the samples pretreated with the pretreatment method of this invention is 191 arcsec (FIG. 5A, solid circles) and 298 arcsec for the regular samples (FIG. 5A, empty inverted triangles). The average values for the (1012) FWHMs are 337 arcsec for the samples pretreated with pretreatment method of this invention (FIG. 5B, solid circles) and 481 arcsec for the regular samples (FIG. 5B, empty inverted triangles). Thus, the implementation of the invented pretreatment for sapphire substrates prior to the HVPE growth of GaN epilayer improves its relevant crystalline structure x-ray characteristics by more than 100 arcsec.

Embodiment 2

In another embodiment of the present invention, a (0001) 6H—SiC substrate is used as a substrate for the growth of AlN epilayer by the HVPE technique. The substrate is 3.5 degree off-oriented toward the a-plane. Again, according to the present invention, prior to the growth of the epilayer, the SiC substrate is subjected to the gas-products of the reaction between HCl and Al. After the pretreatment, deposition of AlN on Si-plane of the substrate is performed using aluminum chloride and ammonia as precursors for the group-III metal and nitrogen, respectively. Morphology and structural properties of the epilayer are analyzed by AFM and XRD, and compared to those of regular epilayers.

The pretreatment is carried out at 400 sccm HCl flow rate through the gas-channel containing high purity Al metal loading. The duration of the pretreatment is 14 min. After the pretreatment, the substrate is exposed to pure $NH_3$ flow at 4 slm rate for 15 min to fulfill nitridation. Growth of the AlN epilayer is then performed for 30 min at regular average growth rate of 0.4 μm/min. The 12 μm thick epilayer demonstrates superior flatness locally characterized by 0.5 nm RMS roughness over 1×1 μm² AFM scan. The structural quality of the epilayer is defined by 115 arcsec FWHM for (0002) symmetric line and 597 arcsec for (1012) asymmetric one. Implementation of the invented pretreatment to off-oriented SiC substrates improves characteristics of deposited AlN epilayer drastically. It is worth mentioning that for the grown on on-oriented SiC substrates regular AlN epilayers acquired 20 nm RMS roughness and 200 arcsec minimal FWHM for (0002) symmetric RC (O. Kovalenkov et al., J. Cryst. Growth, 281 (2005) 87).

Thus in accordance with the invention, the method comprises exposing the substrate to gas products of the reaction between gaseous hydrogen chloride and solid aluminum metal, the gas products being pure or mixed with a carrier gas. The substrate may be subjected to the pretreatment in situ, inside a growth reactor, or outside a growth reactor. When a carrier gas is used, the carrier gas may be hydrogen, nitrogen, argon, and helium gases or a mixture of such gases. The substrate may be one of sapphire ($\alpha$-$Al_2O_3$), silicon carbide (SiC), silicon (Si), lithium aluminate ($LiAlO_2$), gallium arsenide (GaAs), spinel ($MgAlO_4$), gallium nitride (GaN), aluminum nitride (AlN) having polar, semi-polar and non-polar crystal orientation or stacking arrangement of these materials. The substrate itself may be subjected to the pretreatment after being exposed to a gas mixture of ammonia ($NH_3$) and one of hydrogen, nitrogen, argon, and helium gases or a mixture of such gases. The substrate may be subjected to the pretreatment before being exposed to a gas mixture of ammonia ($NH_3$) and a carrier gas. After the pretreatment a pure AlN or AlN containing buffer layer may deposited on the substrate having polar, semi-polar and non-polar crystal orientation, or a pure InN or InN containing buffer layer may be deposited on the substrate. Also after the pretreatment a pure GaN or GaN containing epitaxial layer is deposited preferably by hydride vapor-phase epitaxy (HVPE).

In conclusion: The present invention introduces a new pretreatment method for substrates that are utilized in epitaxial growth of III-Nitride semiconductor technology. Its application effectively promotes excellent structural quality and surface morphology of III-Nitride epilayers. The invented pretreatment provides conditions for producing thinner epilayers with structural perfection corresponding to 2-3 times thicker epilayers, thus avoiding challenges associated with bowing and cracking of the substrates that typically occur when the epilayer thickness is increased in order to improve its crystalline quality. Therefore, the epilayers grown on substrates pretreated with the pretreatment method of this invention are beneficial in producing better performing light-emitting and laser diodes (LEDs and LDs) for solid state light applications and high electron mobility transistors (HEMTs) high-power electronics applications.

While the detailed description of the present invention is based on and essentially referred to the preferred embodiments, it is obvious to one of ordinary skill in the art that modifications may be made therein without leaving the spirit and scope of the invention as defined by the appended claims.

What is claimed is:

1. A method for pretreatment of a substrate for growth of high structural quality and surface flatness group III nitride semiconductor epitaxial layers comprising:
    exposing the substrate to a gas mixture of ammonia ($NH_3$) and one of hydrogen, nitrogen, argon, or helium gases or a mixture of such gases; and
    exposing the substrate to the gas-products of the reaction between gaseous hydrogen chloride and solid aluminum metal;
    the gas-products being pure or mixed with a carrier gas.

2. The method for pretreatment of a substrate of claim 1, wherein the substrate is subjected to the pretreatment in-situ inside a growth reactor.

3. The method for pretreatment of a substrate of claim 1, wherein the substrate is subjected to the pretreatment outside a growth reactor.

4. The method for pretreatment of a substrate of claim 1, wherein a carrier gas is used, and wherein the carrier gas is one of hydrogen, nitrogen, argon, or helium gases or a mixture of such gases.

5. The method for pretreatment of a substrate of claim 1, wherein the substrate is one of sapphire ($\alpha$-$Al_2O_3$), silicon carbide (SiC), silicon (Si), lithium aluminate ($LiAlO_2$), gallium arsenide (GaAs), spinel ($MgAlO_4$), gallium nitride (GaN), or aluminum nitride (AlN) having polar, semi-polar or non-polar crystal orientation or stacking arrangement of these materials.

6. A method for pretreatment of a substrate for growth of high structural quality and surface flatness group III nitride semiconductor epitaxial layers comprising:
    exposing the substrate to the gas-products of the reaction between gaseous hydrogen chloride and solid aluminum metal;
    the gas-products being pure or mixed with a carrier gas; and
    exposing the substrate to a gas mixture of ammonia ($NH_3$) and a carrier gas.

7. The method for pretreatment of a substrate of claim 6, wherein the substrate is subjected to the pretreatment in-situ inside a growth reactor.

8. The method for pretreatment of a substrate of claim 6, wherein the substrate is subjected to the pretreatment outside a growth reactor.

9. The method for pretreatment of a substrate of claim 6, wherein a carrier gas is used, and wherein the carrier gas is one of hydrogen, nitrogen, argon, or helium gases or a mixture of such gases.

10. The method for pretreatment of a substrate of claim 6, wherein the substrate is one of sapphire ($\alpha$-$Al_2O_3$), silicon carbide (SiC), silicon (Si), lithium aluminate ($LiAlO_2$), gallium arsenide (GaAs), spinel ($MgAIO_4$), gallium nitride (GaN), or aluminum nitride (AlN) having polar, semi-polar or non-polar crystal orientation or stacking arrangement of these materials.

11. A method for pretreatment of a substrate for growth of high structural quality and surface flatness group III nitride semiconductor epitaxial layers comprising:
    exposing the substrate to the gas-products of the reaction between gaseous hydrogen chloride and solid aluminum metal;
    the gas-products being pure or mixed with a carrier gas,
    depositing a pure AlN or AlN containing buffer layer on the substrate having polar, semi-polar and non-polar crystal orientation.

12. The method for pretreatment of a substrate of claim 11, wherein after the pretreatment a pure GaN or GaN containing epitaxial layer is deposited preferably by hydride vapor-phase epitaxy (HVPE).

13. The method for pretreatment of a substrate of claim 11, wherein the substrate is subjected to the pretreatment in-situ inside a growth reactor.

14. The method for pretreatment of a substrate of claim 11, wherein the substrate is subjected to the pretreatment outside a growth reactor.

15. The method for pretreatment of a substrate of claim 11, wherein a carrier gas is used, and wherein the carrier gas is one of hydrogen, nitrogen, argon, or helium gases or a mixture of such gases.

16. The method for pretreatment of a substrate of claim 11, wherein the substrate is one of sapphire ($\alpha$-$Al_2O_3$), silicon carbide (SiC), silicon (Si), lithium aluminate ($LiAlO_2$), gallium arsenide (GaAs), spinel ($MgAIO_4$), gallium nitride (GaN), or aluminum nitride (AlN) having polar, semi-polar or non-polar crystal orientation or stacking arrangement of these materials.

17. A method for pretreatment of a substrate for growth of high structural quality and surface flatness group III nitride semiconductor epitaxial layers comprising:
    exposing the substrate to the gas-products of the reaction between gaseous hydrogen chloride and solid aluminum metal;
    the gas-products being pure or mixed with a carrier gas;
    depositing a pure InN or InN containing buffer layer on the substrate.

18. The method for pretreatment of a substrate of claim 17, wherein the substrate is subjected to the pretreatment in-situ inside a growth reactor.

19. The method for pretreatment of a substrate of claim 17, wherein the substrate is subjected to the pretreatment outside a growth reactor.

20. The method for pretreatment of a substrate of claim 17, wherein a carrier gas is used, and wherein the carrier gas is one of hydrogen, nitrogen, argon, or helium gases or a mixture of such gases.

21. The method for pretreatment of a substrate of claim 17, wherein the substrate is one of sapphire ($\alpha$-$Al_2O_3$), silicon carbide (SiC), silicon (Si), lithium aluminate ($LiAlO_2$), gallium arsenide (GaAs), spinel ($MgAIO_4$), gallium nitride (GaN), or aluminum nitride (AlN) having polar, semi-polar or non-polar crystal orientation or stacking arrangement of these materials.

* * * * *